US012641835B2

(12) United States Patent
Ahn et al.

(10) Patent No.: US 12,641,835 B2
(45) Date of Patent: May 26, 2026

(54) DIELECTRIC ENGINEERED TUNNEL REGION IN MEMORY CELLS

(71) Applicant: Micron Technology, Inc., Boise, ID (US)

(72) Inventors: Jae Young Ahn, Boise, ID (US); Terry Hyunsik Kim, Boise, ID (US); Manzar Siddik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 866 days.

(21) Appl. No.: 17/830,013

(22) Filed: Jun. 1, 2022

(65) Prior Publication Data
US 2023/0395672 A1 Dec. 7, 2023

(51) Int. Cl.
*H10D 30/69* (2025.01)
*H10B 43/27* (2023.01)
*H10D 64/68* (2025.01)

(52) U.S. Cl.
CPC .......... *H10D 30/694* (2025.01); *H10B 43/27* (2023.02); *H10D 64/685* (2025.01); *H10D 64/693* (2025.01)

(58) Field of Classification Search
CPC ............... H10D 30/694; H10D 64/685; H10D 64/693; H10B 43/27
See application file for complete search history.

(56) References Cited

U.S. PATENT DOCUMENTS

| | | | |
|---|---|---|---|
| 2005/0059264 A1 | 3/2005 | Cheung et al. | |
| 2008/0283839 A1* | 11/2008 | Watanabe | H10B 41/35 |
| | | | 257/E29.302 |
| 2015/0279955 A1* | 10/2015 | Choi | H10D 64/037 |
| | | | 438/763 |

(Continued)

FOREIGN PATENT DOCUMENTS

| | | | | |
|---|---|---|---|---|
| CN | 110741475 A | * | 1/2020 | H10B 41/10 |
| CN | 117156858 | | 12/2023 | |

OTHER PUBLICATIONS

Hillard, Robert J, "leak characteristics for SiON and High-k Gate Dielectrics", AIP Conference Proceedings 931, 265, (2007), 6 pgs.

(Continued)

*Primary Examiner* — Mohammad M Choudhry
(74) *Attorney, Agent, or Firm* — Schwegman Lundberg & Woessner, P.A.

(57) ABSTRACT

A variety of applications can include memory devices having memory cells, where each memory cell can have an engineered tunnel region between a channel structure of the memory cell and a charge storage region of the memory cell. The engineered tunnel region can be directed to improved read, program, and retention operations of the memory region. In various embodiments, the engineered tunnel region can have multiple dielectric regions with a dielectric constant modulation by inserting material having a dielectric constant that is low relative to silicon nitride and material having a dielectric constant that is high relative to silicon nitride. In various embodiments, the engineered tunnel (Continued)

100

| 102-1 → | CHANNEL STRUCTURE | DIELECTRIC REGION 1 | • • • | DIELECTRIC REGION N | CHARGE STORAGE REGION | DIELECTRIC BLOCKING REGION | GATE |
|---|---|---|---|---|---|---|---|
| | 105-1 | 110-1-1 | | 110-1-N | 115-1 | 120-1 | 125-1 |

| 102-2 → | CHANNEL STRUCTURE | DIELECTRIC REGION 1 | • • • | DIELECTRIC REGION N | CHARGE STORAGE REGION | DIELECTRIC BLOCKING REGION | GATE |
|---|---|---|---|---|---|---|---|
| | 105-2 | 110-2-1 | | 110-2-N | 115-2 | 120-2 | 125-2 |

| 102-M → | CHANNEL STRUCTURE | DIELECTRIC REGION 1 | • • • | DIELECTRIC REGION N | CHARGE STORAGE REGION | DIELECTRIC BLOCKING REGION | GATE |
|---|---|---|---|---|---|---|---|
| | 105-M | 110-M-1 | | 110-M-N | 115-M | 120-M | 125-M | region of a memory cell can have multiple dielectric regions with material having deep traps near the charge storage region of the memory cell. Other engineered tunnel regions are disclosed.

15 Claims, 9 Drawing Sheets

(56) References Cited

U.S. PATENT DOCUMENTS

2016/0126248 A1*  5/2016  Rabkin ................. H10B 43/40
                                                    438/258
2016/0172366 A1*  6/2016  Koka ............... H01L 21/02332
                                                    257/314
2018/0374866 A1*  12/2018  Makala ............... H10D 62/151

OTHER PUBLICATIONS

Kim, Y B, "Physical and Electrical Properties of Atomic Layer Deposited HfO2 for Gate Dielectric Application", Journal of the Korean Physical Society, vol. 42, (Apr. 2003), 3 pgs.

Lee, Jaemin, "Characteristics of low-? SiOC films deposited via atomic layer deposition", Thin Solid Films vol. 645, (Jan. 2018), pp. 334-339.
Muraoka, K, "Optimum structure of deposited ultrathin silicon oxynitride film to minimize leakage current", Journal of Applied Physics 94, 2038, (2003), 2 pgs.
Podlucky, Lubos, "Optimization of Fabrication Process for SiON SiOx Films Applicable as Optical Waveguides", Coatings 2021 11, 574, (May 15, 2021), 11 pgs.
Robertson, J., "High dielectric constant oxides", Eur. Phys. J. Appl. Phys., vol. 28, (2004), 265-291.
Samnakay, Rameez, "Reliability characterization of SiON and MGHK MOSFETs using flicker noise and its correlation with the bias temperature instability", Solild-State Electronics 135 37-42, (2017), 6 pgs.
Southwick, R G, "Time dependent dielectric breakdown of SiN, SiBCN and SiOCN spacer dielectrics", 2017 IEEE International Reliability Physics Symposium (IRPS), (Apr. 2017), 5 pgs.
Triyoso, D H, "Characterization of atomic layer deposited low-k spacer for FDSOI high-k metal gate transistor", 2017 IEEE International Conference on IC Design and Technology (ICICDT), (May 2017), 4 pgs.
Yamashita, T, "A novel ALD SiBCN low-k spacer for parasitic capacitance reduction in FinFETs", 2015 Symposium on VLSI Technology (VLSI Technology), (Jun. 2015), 2 pgs.

* cited by examiner

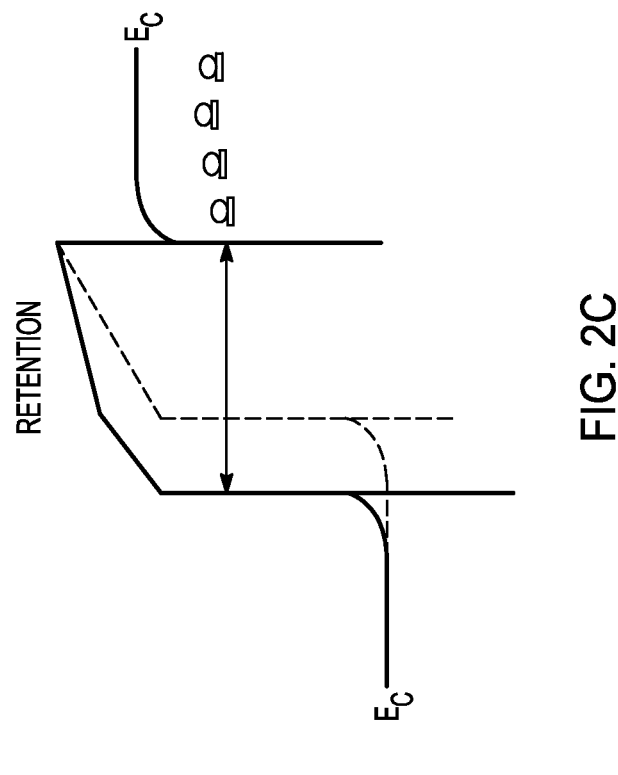
FIG. 2C
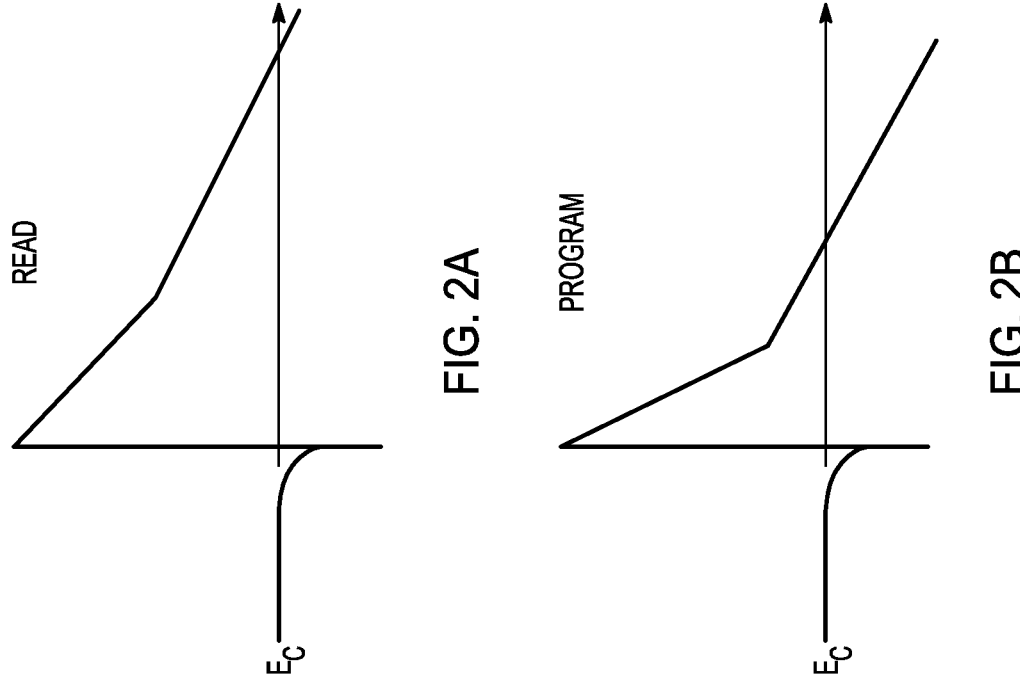
FIG. 2A
FIG. 2B

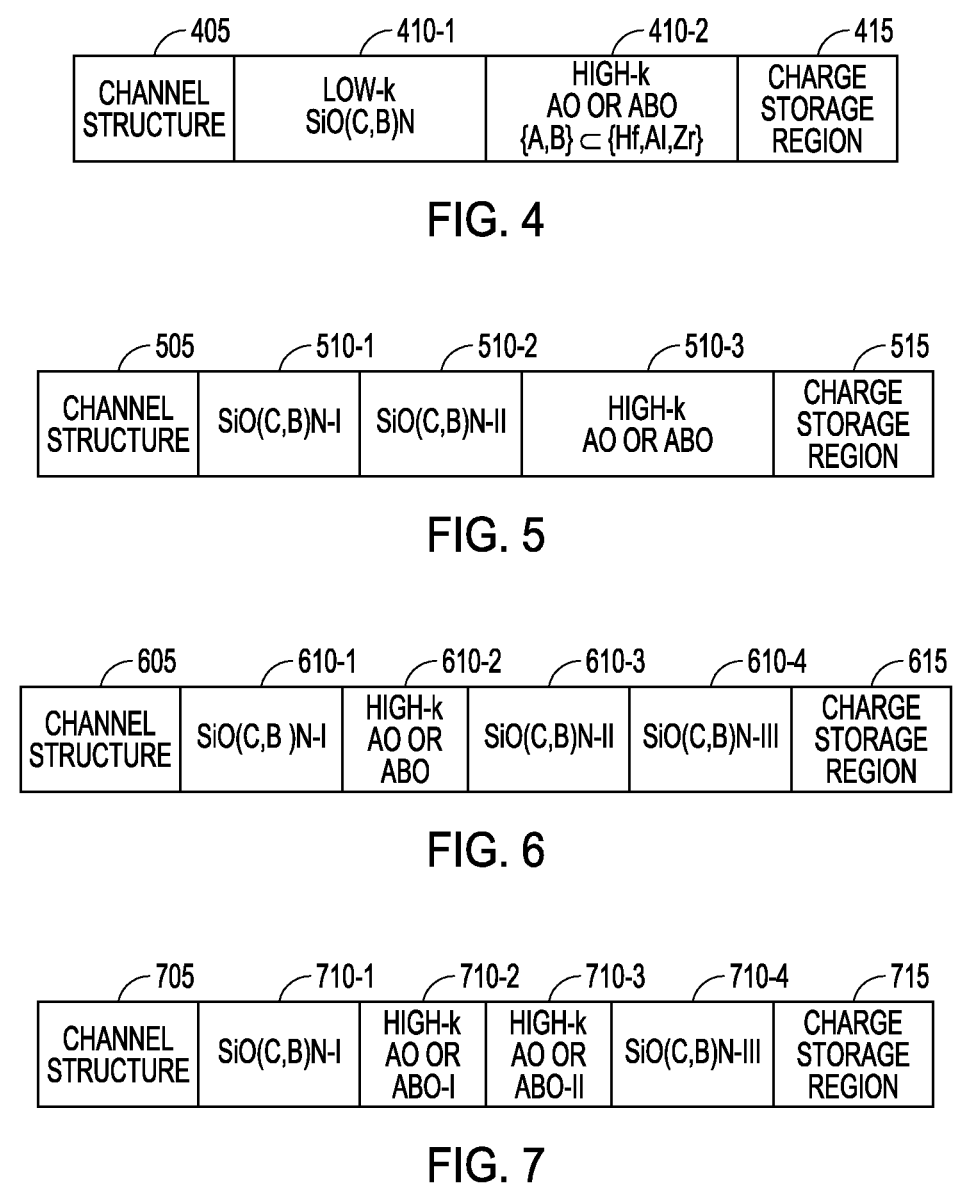

| 405 | 410-1 | 410-2 | 415 |
|---|---|---|---|
| CHANNEL STRUCTURE | LOW-k SiO(C,B)N | HIGH-k AO OR ABO {A,B} ⊂ {Hf,Al,Zr} | CHARGE STORAGE REGION |

FIG. 4

| 505 | 510-1 | 510-2 | 510-3 | 515 |
|---|---|---|---|---|
| CHANNEL STRUCTURE | SiO(C,B)N-I | SiO(C,B)N-II | HIGH-k AO OR ABO | CHARGE STORAGE REGION |

FIG. 5

| 605 | 610-1 | 610-2 | 610-3 | 610-4 | 615 |
|---|---|---|---|---|---|
| CHANNEL STRUCTURE | SiO(C,B )N-I | HIGH-k AO OR ABO | SiO(C,B)N-II | SiO(C,B)N-III | CHARGE STORAGE REGION |

FIG. 6

| 705 | 710-1 | 710-2 | 710-3 | 710-4 | 715 |
|---|---|---|---|---|---|
| CHANNEL STRUCTURE | SiO(C,B)N-I | HIGH-k AO OR ABO-I | HIGH-k AO OR ABO-II | SiO(C,B)N-III | CHARGE STORAGE REGION |

FIG. 7

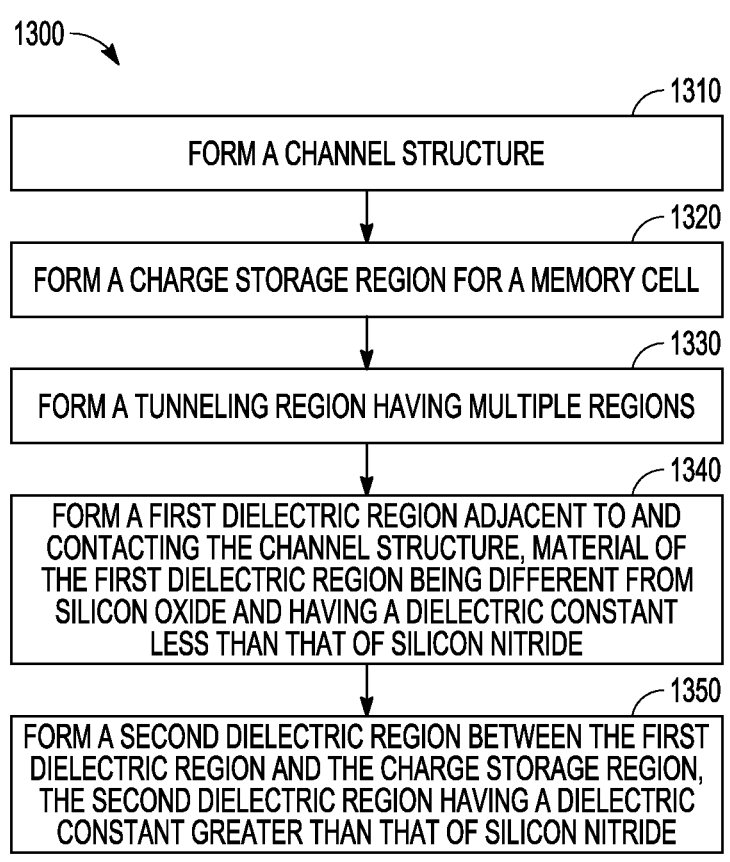

1300 —

1310
FORM A CHANNEL STRUCTURE

1320
FORM A CHARGE STORAGE REGION FOR A MEMORY CELL

1330
FORM A TUNNELING REGION HAVING MULTIPLE REGIONS

1340
FORM A FIRST DIELECTRIC REGION ADJACENT TO AND CONTACTING THE CHANNEL STRUCTURE, MATERIAL OF THE FIRST DIELECTRIC REGION BEING DIFFERENT FROM SILICON OXIDE AND HAVING A DIELECTRIC CONSTANT LESS THAN THAT OF SILICON NITRIDE

1350
FORM A SECOND DIELECTRIC REGION BETWEEN THE FIRST DIELECTRIC REGION AND THE CHARGE STORAGE REGION, THE SECOND DIELECTRIC REGION HAVING A DIELECTRIC CONSTANT GREATER THAN THAT OF SILICON NITRIDE

FIG. 13

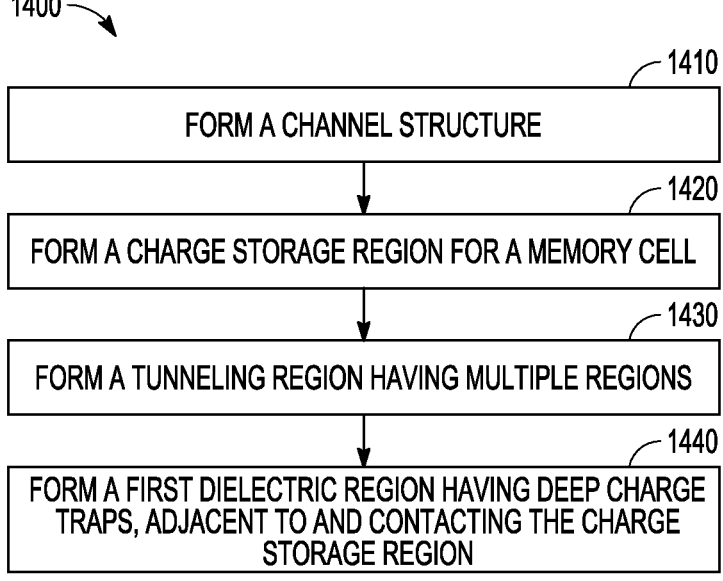

1400 —

1410
FORM A CHANNEL STRUCTURE

1420
FORM A CHARGE STORAGE REGION FOR A MEMORY CELL

1430
FORM A TUNNELING REGION HAVING MULTIPLE REGIONS

1440
FORM A FIRST DIELECTRIC REGION HAVING DEEP CHARGE TRAPS, ADJACENT TO AND CONTACTING THE CHARGE STORAGE REGION

1510
FORM A CHANNEL STRUCTURE

1520
FORM A CHARGE STORAGE REGION FOR A MEMORY CELL

1530
FORM A TUNNELING REGION HAVING MULTIPLE REGIONS

1540
FORM A SILICON OXYNITRIDE REGION ADJACENT TO AND
CONTACTING THE CHARGE STORAGE REGION

1550
FORM A SILICON OXIDE REGION ADJACENT TO AND
CONTACTING THE CHANNEL STRUCTURE

DIELECTRIC ENGINEERED TUNNEL REGION IN MEMORY CELLS

FIELD OF THE DISCLOSURE

Embodiments of the disclosure relate generally to electronic devices and systems and, more specifically, to memory cells of electronic devices and systems and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line. Enhancements to the structure or design of memory cells in memory devices or other devices can provide for higher quality operation of the memory devices such as with respect to read, program, and retention.

BRIEF DESCRIPTION OF THE DRAWINGS

The drawings, which are not necessarily drawn to scale, illustrate generally, by way of example, but not by way of limitation, various embodiments discussed in the present document.

FIGS. 2A-2C show modeling of conduction band slope across the tunnel region with respect to modulation of dielectric constant in different regions for improved read, program, and retention operations, in accordance with various embodiments.

FIG. 4 represents an example of a memory cell having a tunnel region between a channel structure of the memory cell and a charge storage region of the memory cell, where the tunnel region has two dielectric regions, in accordance with various embodiments.

FIG. 5 represents an example of a memory cell having a tunnel region between a channel structure of the memory cell and a charge storage region of the memory cell, where the tunnel region has three dielectric regions, in accordance with various embodiments.

FIG. 6 represents an example of a memory cell having a tunnel region between a channel structure of the memory cell and a charge storage region of the memory cell, where the tunnel region has four dielectric regions, in accordance with various embodiments.

FIG. 7 represents another example of a memory cell having a tunnel region between a channel structure of the memory cell and a charge storage region of the memory cell, where the tunnel region has four dielectric regions, in accordance with various embodiments.

FIG. 13 is a flow diagram of features of an example method of forming a memory device, according to various embodiments.

FIG. 14 is a flow diagram of features of another example method of forming a memory device, in accordance with various embodiments.

DETAILED DESCRIPTION

Figure 1:
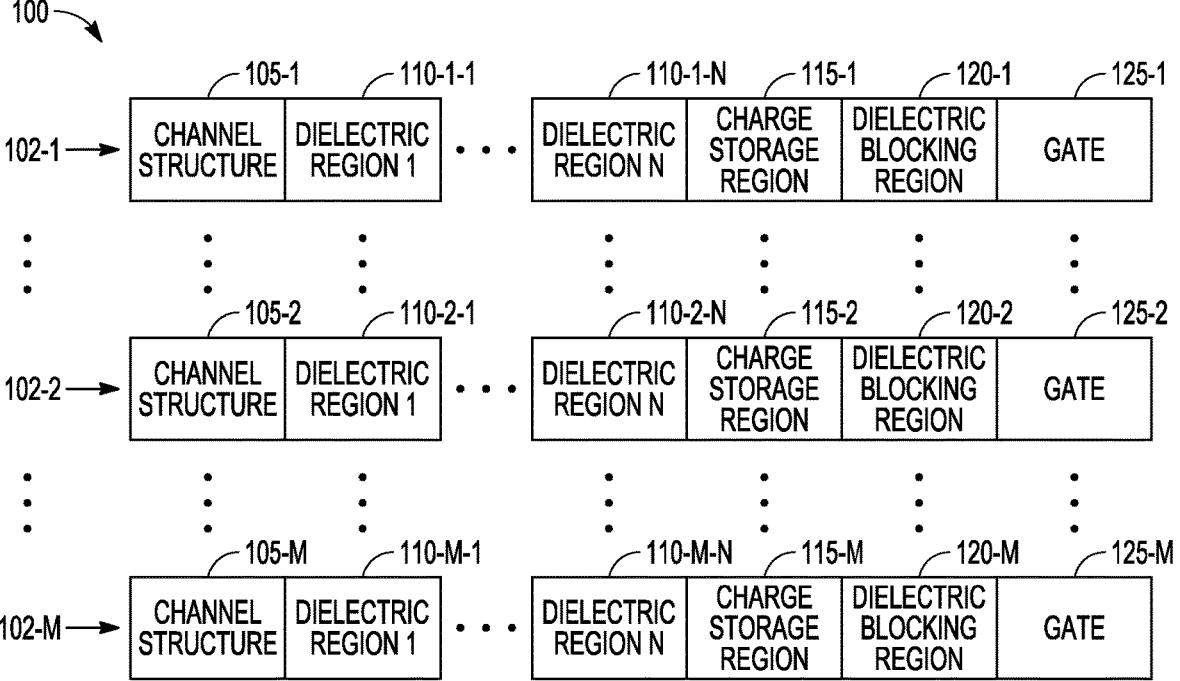
FIG. 1 is a block diagram representation of a memory device having a string of memory cells, in accordance with various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current-encoded data values of selected memory cells on the data lines.

Each flash memory cell in a NOR or NAND architecture semiconductor memory array can be programmed to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein, in its broader context, to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store 5 bits of data per cell.

To increase the amount of data to be stored in a memory device, design trends towards increasing the density of memory cells in 3D arrays, in which memory cell size is undergoing continuous scaling. The continuous scaling results in reduced tier pitch (vertical distance between the centers of two adjacent memory cells in a vertical string of memory cells, for example), increases maximum program voltage and degrades the memory device with respect to memory cell to memory cell interference. Memory cells can be structured with a tunnel region between a channel structure in which current can flow and a charge storage region in which charge is maintained to affect the current flow according to data being stored in the memory cells. The tunnel region can be engineered according to energy bandgaps of the material for the tunnel region. Previous engineering has been approached according to traditional retention and endurance specifications. With conventional bandgap engineering using $SiO_xN_y$, or a high-k tunneling region, it has been difficult to break program and read current trade-off due to insufficient conduction band slope. Silicon oxynitride (SiON) is a dielectric material in which SiON films have variable parameters, ranging from silicon dioxide ($SiO_2$) to silicon nitride ($Si_3N_4$). Herein, the term "high-k" refers to the dielectric constant of a material being greater than the dielectric constant of silicon nitride, and the term "low-k" refers to the dielectric constant of a material being less than the dielectric constant of silicon nitride.

FIG. 1 is a block diagram representation of a memory device 100 having a string of memory cells 102-1, 102-2, . . . 102-M, where in a 3D memory array structure each of memory cells 102-1, 102-2, . . . 102-M is on a different tier from the other ones of the memory cells. The regions are not shown to scale. Memory cell 102-1 can include a channel structure 105-1 separated from a charge storage region 115-1 by a tunnel region having multiple dielectric regions: dielectric region 110-1-1 . . . dielectric region 110-1-N. In memory cell 102-1, charge storage region 115-1 can be separated from a gate 125-1 by a dielectric blocking region 120-1, where dielectric blocking region 120-1 can be structured as multiple dielectric regions. Memory cell 102-2 can include a channel structure 105-2 separated from a charge storage region 115-2 by a tunnel region having multiple dielectric regions: dielectric region 110-2-1 . . . dielectric region 110-2-N. In memory cell 102-2, charge storage region 115-2 can be separated from a gate 125-2 by a dielectric blocking region 120-2, where dielectric blocking region 120-2 can be structured as multiple dielectric regions. Memory cell 102-M can include a channel structure 105-M separated from a charge storage region 115-M by a tunnel region having multiple dielectric regions: dielectric region 110-M-1 . . . dielectric region 110-M-N. In memory cell 102-M, charge storage region 115-M can be separated from a gate 125-M by a dielectric blocking region 120-M, where dielectric blocking region 120-M can be structured as multiple dielectric regions.

Though shown as separated regions in memory device 100, channel structures 105-1, 105-2 . . . 105-M can be structured as a continuous region in the z-direction, while each of gates 125-1, 125-2 . . . 125-M are separated from adjacent gates by an electrically insulating region. The tunnel regions, the charge storage regions, and the dielectric blocking regions of the memory cells 102-1, 102-2 . . . 102-M can be structured as a continuous region in the z-direction. Variations of a memory string with continous channel structures between memory cells and electrical insulatin between the gates of the memory cells can include permutations of voids between the tunnel regions, the charge storage regions, and the dielectric blocking regions of the memory cells 102-1, 102-2 . . . 102-M, respectively.

FIGS. 2A-2C show modeling of conduction band slope across the tunnel region with respect to modulation of dielectric constant in different regions for improved read operation, program operation, and retention. FIG. 2A shows conduction band edge for a read operation with respect to a conduction band edge of the channel structure with energy $E_C$ and across the tunnel region, where the slope of the conduction band edge changes with change in the dielectric constant across the tunnel region. FIG. 2B shows conduction band edge for a program operation with respect to a conduction band edge of the channel structure with energy $E_C$ and across the tunnel region, where the slope of the conduction band edge changes with change in the dielctric constant across the tunnel region. The conduction band edge changes to a greater extent for the program operation relative to the read operation. FIG. 2C shows, for retention, a change in the conduction band edge across the tunnel region for tunnel region having a change in dielectric constant relative to a tunnel region without a change in dielectric constant across the tunnel region. Such changes in conduction band edge across the tunnel can be used to increase tunneling efficiency.

Modeling can be conducted directed to improvements in read operation, program operation, and retention. For a read operation at low electric field, a longer tunneling distance improves read disturb. For a program operation at high electric field, shorter tunneling distance improves program voltage. For cell-to-cell interference, equivalent oxide thickness (EOT) scaling with higher effective dielectric constant can provide improvements. For retention, improved charge loss can be attained by thicker physical film thickness, which can be provided by dielectric engineering. To meet this modeling, dielectric properties of the tunnel region can be manipulated to provide improvements beyond the conventional tunnel region of a silicon oxide, silicon nitride, and a silicon nitride (ONO) arranged in order between the channel structure and the charge storage region. Equivalent oxide thickness (EOT), also represented by $t_{eq}$ or $t_{ox}$, is an oxide thickness of silicon dioxide to be used to achieve similar capacitance density of a given dielectric of a transistor. For a typical dielectric used as a gate dielectric, the capacitance is determined as one for a parallel plate capacitance: $C = \kappa \varepsilon_0 A/t$, where $\kappa$ is the dielectric constant, $\varepsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox} = 3.9$, as $t = (\kappa/\kappa_{ox})t_{eq} = (\kappa/3.9)t_{eq}$. Thus, materials with a dielectric constant greater than that of $SiO_2$, 3.9, will have a physical thickness that can be considerably larger than a desired $t_{eq}$, while providing the desired equivalent oxide thickness for capacitance considerations.

In various embodiments, a tunneling region of a memory cell can be structured with a dielectric constant modulation by inserting low-k dielectric regions and high-k dielectric regions together in a tunneling region as showed in FIG. 1, for example. As noted above, low-k and high-k dielectrics are defined herein with respect to the dielectric constant of silicon nitride. The arrangements and selection of materials for a tunneling region can be constructed to meet a modeling directed at improving operations of the memory cell. A high-k dielectric allows for a larger thickness to be used to attain a desired smaller thickness for efficient tunneling.

In various embodiments, a tunneling region of a memory cell can include a first dielectric region and a second dielectric region. The first dielectric region can be structured adjacent and contacting the channel structure of a memory cell, where the first dielectric region can be a low-k dielectric region. The second dielectric region can be structured adjacent and contacting the charge storage region of the memory cell, where the second dielectric region adjacent can be a high-k dielectric region.

In various embodiments, a tunneling region of a memory cell can include a first dielectric region, a second dielectric region, and a third dielectric region. The first dielectric region can be structured adjacent and contacting the channel structure of the memory cell, where the first dielectric region can be a low-k dielectric region. The second dielectric region can be structured adjacent and contacting the charge storage region of the memory cell, where the second dielectric region adjacent can be a high-k dielectric region. The third dielectric region can be located between the first and second dielectric regions, where the third dielectric region can be a low-k dielectric region.

In various embodiments, a tunneling region of a memory cell can include a first dielectric region, a second dielectric region, a third dielectric region, and a fourth dielectric region. The first dielectric region can be structured adjacent and contacting the channel structure of the memory cell, where the first dielectric region can be a low-k dielectric region. The second dielectric region can be structured adjacent and contacting the first dielectric region, where the second dielectric region can be a high-k dielectric region. The third dielectric region and the fourth dielectric region can be located between the second dielectric region and the charge storage region of the memory cell, where the third dielectric region and the fourth dielectric region can be low-k dielectric regions. Material of the third dielectric region and material of the fourth dielectric region can have different dielectric constants from each other.

In various embodiments, a tunneling region can include a first dielectric region, a second dielectric region, a third dielectric region, and a fourth dielectric region. The first dielectric region can be structured adjacent and contacting the channel structure of a memory cell, where the first dielectric region can be a low-k dielectric region. The second dielectric region can be structured adjacent and contacting the first dielectric region, where the second dielectric region can be a high-k dielectric region. The third dielectric region can be structured adjacent and contacting the second dielectric region, where the third dielectric region can be a high-k dielectric region. Material of the second dielectric region and material of the third dielectric region can have different dielectric constants from each other. The fourth dielectric region can be located between the third dielectric region and the charge storage region of the memory cell, where the fourth dielectric region can be a low-k dielectric region.

A tunneling region having multiple dielectric regions can be implemented as variations of the above example embodiments with respect to low-k and high-k dielectric regions. For example, in each of the embodiments, the first dielectric region of the multiple dielectric regions of the tunnel region can have, but is not limited to, the lowest dielectric constant of the multiple dielectric regions. Variations can include the low-k dielectric region having any number of material compositions that have a low-k dielectric constant and can meet specifications of modeling to improve operation of the memory cell. For example, the low-k dielectric constant material can be a low-k compound, a compound doped to have a low-k dielectric constant, a compound with varying content of one or more elements relative to the other elements to attain a low-k dielectric constant, a doped compound with varying content of one or more elements of the compound relative to the other elements of the compound to attain a low-k dielectric constant, or other types of materials having a low-k dielectric constant. A compound is material having a combination of two or more different chemical elements, in such a way that the atoms of the different elements are held together by chemical bonds. A doped compound is a compound in which an element, different from the elements defining the compound, is inserted interstitially or substitutionally in the compound. The following nomenclature A(X, Y)C means that compound AC is doped with elements X, Y, or both X and Y. This nomenclature can be extended to other compounds, such as AB(X, Y)C. Examples of low-k dielectric compounds can include, but are not limited to, silicon oxycarbide (SiOC) and SiON. Examples of doped low-k dielectric compound can include, but are not limited to, SiON doped with carbon, boron, or carbon and boron (SiO(C, B)N) and SiO doped with carbon. An example of a compound with varying content of one or more elements can include, but is not limited to, a SiON dielectric region with varying content (concentration) of nitrogen as a function of distance across the SiON dielectric region, for example in the x-direction as shown in FIG. 1. Varying content of nitrogen of SiON as a function of distance can be referred to as a nitrogen profile of SiON.

Various combinations of dielectric regions or varying dielectric constants as a function of distance with respect to a channel structure and a charge storage region within dielectric regions for a tunneling region, which can provide appropriate variations of conduction band slope across the tunnel region, can be implemented to provide deep traps near the charge storage region of a memory cell to improve read operation, program operation, and retention. A deep trap of a material is an electron energy trap located at least 1 eV below the conduction band edge of the material.

Figure 3A:
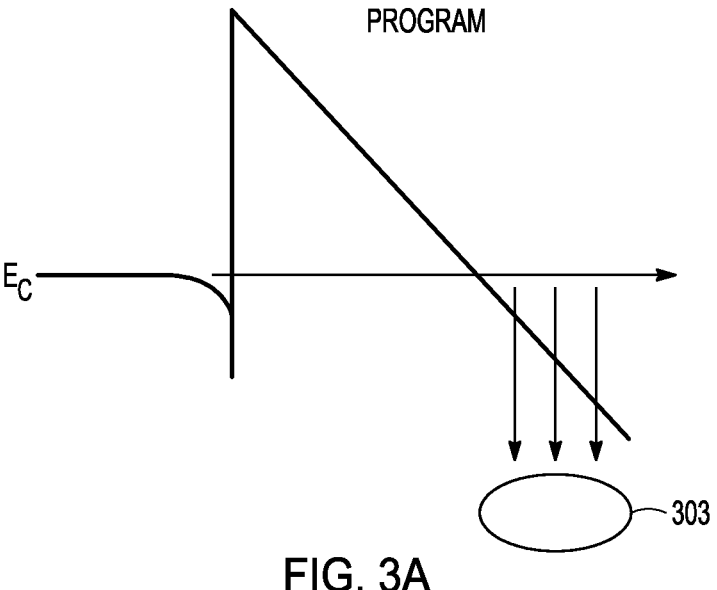
FIGS. 3A-3B illustrate deep traps near the charge storage region of a memory cell, in accordance with various embodiments.
Figure 3B:
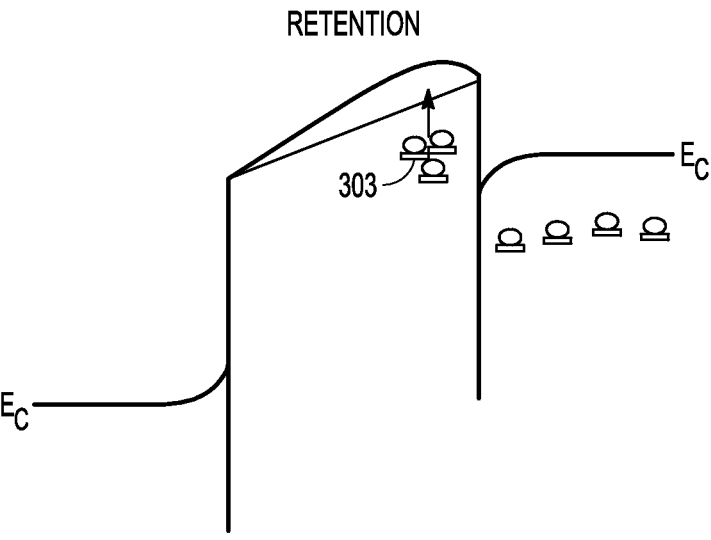

FIGS. 3A-3B illustrate deep traps 303 near the charge storage region of a memory cell. FIG. 3A shows conduction band edge for a program operation with respect to a conduction band edge of the channel structure with energy $E_C$ and across the tunnel region, where electrons are captured in deep traps 303 near the charge storage region of the memory cell. FIG. 3B shows, for retention, a change in the conduction band edge across the tunnel region for electrons captured in deep traps near the charge storage region of the memory cell.

Modeling can be conducted directed to improvements in read operation, program operation, and retention with respect to deep traps. For a program operation at high electric field, tunneling can be conducted into the conduction band and capturing in the deep traps. In certain scenarios, some amount of electrons could be captured by the deep traps during read operation as well. For retention, enhanced barrier can be attained for charge loss by trapped electrons. Effective EOT scaling for the tunnel region can improve access line voltage-threshold voltage (VgVt) characteristics with respect to reading and cell-to-cell interference. Such changes in conduction band edge across the tunnel can be used to increase tunneling efficiency.

In various embodiments, a tunneling region of a memory cell can be structured having multiple dielectric regions including a dielectric region with deep traps near the charge storage region of the memory cell to provide effective EOT scaling. Deep traps can be formed by doping. For example, SiON can be doped with C, B, or C and B. Other dopants can be used such as, but not limited to, Hf, Al, or Zr. A first dielectric region of the multiple dielectric regions can be structured adjacent and contacting the charge storage region with deep traps near the charge storage region. A second dielectric region of the multiple dielectric regions can be structured adjacent and contacting the channel structure. The second dielectric region can be a doped dielectric with varying content across the second dielectric. The varying content can be varying content of an element of the dielectric, varying content of one or more dopants of the doped dielectric, or varying content of an element of the dielectric and varying content of one or more dopants of the doped dielectric. The varying content can be in the x-direction as shown in FIG. 1.

In various embodiments, a tunneling region of a memory cell can be structured having multiple dielectric regions including a dielectric region with deep traps near the charge storage region of the memory cell, where the multiple dielectric regions include three dielectric regions. A first dielectric region of the multiple dielectric regions can be structured adjacent and contacting the charge storage with deep traps near the charge storage region. A second dielectric region of the multiple dielectric regions can be structured adjacent and contacting the channel structure. The second dielectric region can be a doped dielectric with varying content across the second dielectric region. The varying content can be varying content of an element of the dielectric, varying content of one or more dopants of the doped dielectric, or varying content of an element of the dielectric and varying content of one or more dopants of the doped dielectric. A third dielectric region can be structured between the first dielectric region and the second dielectric region. The third dielectric region can be a doped dielectric with varying content across the third dielectric region. The varying content can be varying content of an element of the dielectric, varying content of one or more dopants of the doped dielectric, or varying content of an element of the dielectric and varying content of one or more dopants of the doped dielectric. The composition or profile of the third dielectric region can be different from the composition or profile of the second dielectric region.

In various embodiments, a tunneling region of a memory cell can be structured having multiple dielectric regions including a dielectric region with deep traps near the charge storage region of the memory cell, where the multiple dielectric regions include four dielectric regions. A first dielectric region of the multiple dielectric regions can be structured adjacent and contacting the charge storage with deep traps near the charge storage region. A second dielectric region of the multiple dielectric regions can be structured adjacent and contacting the channel structure. The second dielectric region can be a doped dielectric with varying content across the second dielectric region. The varying content can be varying content of an element of the dielectric, varying content of one or more dopants of the doped dielectric, or varying content of an element of the dielectric and varying content of one or more dopants of the doped dielectric. A third dielectric region and a fourth dielectric region can be structured between the first dielectric region and the second dielectric region. The third dielectric region can be a doped dielectric with varying content across the third dielectric region. The varying content can be varying content of an element of the dielectric, varying content of one or more dopants of the doped dielectric, or varying content of an element of the dielectric and varying content of one or more dopants of the doped dielectric. The fourth dielectric region can be a doped dielectric with varying content across the fourth dielectric region. The varying content can be varying content of an element of the dielectric, varying content of one or more dopants of the doped dielectric, or varying content of an element of the dielectric and varying content of one or more dopants of the doped dielectric. The composition or profile of the third dielectric region and the composition or profile of the fourth dielectric region can be different from each other and from the composition or profile of the second dielectric region.

The tunneling region of a memory cell structured having more than two dielectric regions can include a first dielectric region with deep traps adjacent and contacting the charge storage region of the memory cell, a second dielectric region with varying content adjacent and contacting the channel structure region of the memory cell, and one or more dielectric regions in which contents of the dielectric of the one or more dielectric regions do not vary. Each dielectric region of the tunneling region can be a low-k dielectric.

FIG. 4 represents an embodiment of an example of a memory cell having a tunnel region between a channel structure 405 of the memory cell and a charge storage region 415, where the tunnel region includes dielectric regions 410-1 and 410-2. Dielectric region 410-1 can be structured adjacent and contacting channel structure 405, where dielectric region 410-1 can include low-k SiO(C,B)N. Low-k dielectrics other than low-k SiO(C,B)N can be used. Dielectric region 410-2 can be structured adjacent and contacting charge storage region 415, where dielectric region 410-2 can include a high-k single metal oxide AO or a double metal oxide ABO, where A and B can be selected from hafnium (Hf), aluminum (Al), or zirconium (Zr). Other metals can be used in the high-k metal oxides. Channel structure 405 can include polysilicon and charge storage region 415 can include a nitride such as, but not limited to, silicon nitride.

FIG. 5 represents an embodiment of an example of a memory cell having a tunnel region between a channel structure 505 of the memory cell and a charge storage region 515, where the tunnel region includes dielectric regions 510-1, 510-2, and 510-3. Dielectric region 510-1 can be structured adjacent and contacting channel structure 505, where dielectric region 510-1 can include low-k SiO(C,B)N. Dielectric region 510-2 can be structured between dielectric region 510-1 and dielectric region 510-3, where dielectric region 510-2 can include low-k SiO(C,B)N. The composition or profile of low-k SiO(C,B)N in dielectric region 510-1 can be different from the composition or profile of low-k SiO(C,B)N in dielectric region 510-2. Low-k dielectrics other than low-k SiO(C,B)N can be used in dielectric regions 510-1 and 510-2. Dielectric region 510-3 can be structured adjacent and contacting charge storage region 515, where dielectric region 510-3 can include a high-k single metal oxide AO or a double metal oxide ABO, where A and B can be selected from hafnium (Hf), aluminum (Al), or zirconium (Zr). Other metals can be used in the high-k metal oxides. Channel structure 505 can include polysilicon and charge storage region 515 can include a nitride such as, but not limited to, silicon nitride.

FIG. 6 represents an embodiment of an example of a memory cell having a tunnel region between a channel structure 605 of the memory cell and a charge storage region 615, where the tunnel region includes dielectric regions 610-1, 610-2, 610-3, and 610-4. Dielectric region 610-1 can be structured adjacent and contacting channel structure 605, where dielectric region 610-1 can include low-k SiO(C,B)N. Dielectric region 610-2 can be structured between dielectric region 610-1 and dielectric region 610-3, where dielectric region 610-2 can include a high-k single metal oxide AO or a double metal oxide ABO, where A and B can be selected from hafnium (Hf), aluminum (Al), or zirconium (Zr). Other metals can be used in the high-k metal oxides. Dielectric region 610-3 can be structured between dielectric region 610-2 and dielectric region 610-4, where dielectric region 610-3 can include low-k SiO(C,B)N. Dielectric region 610-4 can be structured between dielectric region 610-3 and charge storage region 615 and can include low-k SiO(C,B)N. Low-k SiO(C,B)N in dielectric regions 610-1, 610-3, and 610-4 can have a composition or profile different from each other. Low-k dielectrics other than low-k SiO(C,B)N can be used in dielectric regions 610-1, 610-3, and 610-4. Channel structure 605 can include poly silicon and charge storage region 615 can include a nitride such as, but not limited to, silicon nitride.

FIG. 7 represents an embodiment of an example of a memory cell having a tunnel region between a channel structure 705 of the memory cell and a charge storage region 715, where the tunnel region includes dielectric regions 710-1, 710-2, 710-3, and 710-4. Dielectric region 710-1 can be structured adjacent and contacting channel structure 705, where dielectric region 710-1 can include low-k SiO(C,B)N. Dielectric region 710-2 can be structured between dielectric region 710-1 and dielectric region 710-3, where dielectric region 710-2 can include a high-k single metal oxide AO or double metal oxide ABO, where A and B can be selected from hafnium (Hf), aluminum (Al), or zirconium (Zr). Other metals can be used in the high-k metal oxides. Dielectric region 710-3 can be structured between dielectric region 710-2 and dielectric region 710-4, where dielectric region 710-3 can include a high-k single metal oxide AO or a double metal oxide ABO, where A and B can be selected from hafnium (Hf), aluminum (Al), or zirconium (Zr). Other metals can be used in the high-k metal oxides. High-k single metal oxide AO or double metal oxide ABO in dielectric regions 710-2 and 710-3 can have a composition or profile different from each other. Dielectric region 710-4 can be structured between dielectric region 710-3 and charge storage region 715 and can include low-k SiO(C,B)N. Low-k SiO(C,B)N in dielectric regions 710-1 and 710-4 can have a composition or profile different from each other. Low-k dielectrics other than low-k SiO(C,B)N can be used in dielectric regions 710-1 and 710-4. Channel structure 705 can include polysilicon and charge storage region 715 can include a nitride such as, but not limited to, silicon nitride.

Figure 8:
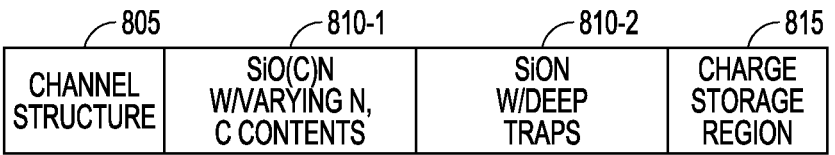
FIG. 8 represents another example of a memory cell having a tunnel region between a channel structure of the memory cell and a charge storage region of the memory cell, where the tunnel region has two dielectric regions, in accordance with various embodiments.

FIG. 8 represents an embodiment of an example of a memory cell having a tunnel region between a channel structure 805 of the memory cell and a charge storage region 815, where the tunnel region includes dielectric regions 810-1 and 810-2. Dielectric region 810-1 can be structured adjacent and contacting channel structure 805, where dielectric region 810-1 can include low-k SiO(C)N with varying N or C content. Low-k dielectrics other than low-k SiO(C)N can be used. Dielectric region 810-2 can be structured adjacent and contacting charge storage region 815, where dielectric region 810-2 can include SiON with deep traps. Low-k dielectrics with deep traps other than low-k SiON can be used. Channel structure 805 can include polysilicon and charge storage region 815 can include a nitride such as, but not limited to, silicon nitride.

Figure 9:
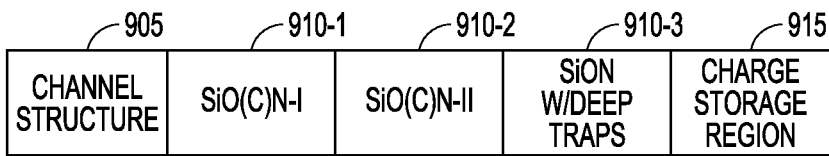
FIG. 9 represents another example of a memory cell having a tunnel region between a channel structure of the memory cell and a charge storage region of the memory cell, where the tunnel region has three dielectric regions, in accordance with various embodiments.

FIG. 9 represents an embodiment of an example of a memory cell having a tunnel region between a channel structure 905 of the memory cell and a charge storage region 915, where the tunnel region includes dielectric regions 910-1, 910-2, and 910-3. Dielectric region 910-1 can be structured adjacent and contacting channel structure 905, where dielectric region 910-1 can include low-k SiO(C)N. Dielectric region 910-2 can be structured between dielectric region 910-1 and dielectric region 910-3, where dielectric region 910-2 can include low-k SiO(C)N. The profile of low-k SiO(C)N in dielectric region 910-1 can be different from the profile of low-k SiO(C)N in dielectric region 910-2. Low-k dielectrics other than low-k SiO(C)N can be used in dielectric regions 910-1 and 910-2. Dielectric region 910-3 can be structured adjacent and contacting charge storage region 915, where dielectric region 910-3 can include SiON with deep traps. Low-k dielectrics with deep traps other than low-k SiON can be used. Channel structure 905 can include polysilicon and charge storage region 915 can include a nitride such as, but not limited to, silicon nitride.

Figure 10:
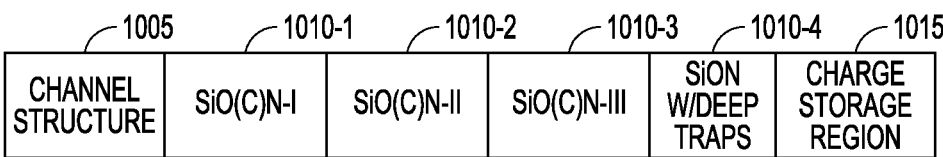
FIG. 10 represents another example of a memory cell having a tunnel region between a channel structure of the memory cell and a charge storage region of the memory cell, where the tunnel region has four dielectric regions, in accordance with various embodiments.

FIG. 10 represents an embodiment of an example of a memory cell having a tunnel region between a channel structure 1005 of the memory cell and a charge storage region 1015, where the tunnel region includes dielectric regions 1010-1, 1010-2, 1010-3, and 1010-4. Dielectric region 1010-1 can be structured adjacent and contacting channel structure 1005, where dielectric region 1010-1 can include a low-k SiO(C)N. Dielectric region 1010-2 can be structured between dielectric region 1010-1 and dielectric region 1010-3, where dielectric region 1010-2 can include low-k SiO(C)N. Dielectric region 1010-3 can be structured between dielectric region 1010-2 and dielectric region 1010-4, where dielectric region 1010-3 can include low-k SiO(C)N. Dielectric region 1010-4 can be structured between dielectric region 1010-3 and charge storage region 1015 and can include SiON with deep traps. Low-k dielectrics with deep traps other than low-k SiON can be used. Low-k SiO(C)N in dielectric regions 1010-1, 1010-3, and 1010-4 can have a profile different from each other. Low-k dielectrics other than low-k SiO(C)N can be used in dielectric regions 1010-1, 1010-3, and 1010-4. Channel structure 1005 can include polysilicon and charge storage region 1015 can include a nitride such as, but not limited to, silicon nitride.

Figure 11:
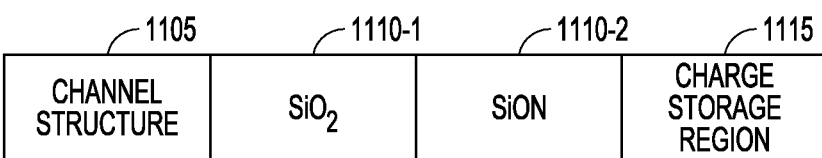
FIG. 11 represents another example of a memory cell having a tunnel region between a channel structure of the memory cell and a charge storage region of the memory cell, where the tunnel region has multiple dielectric regions, according to various embodiments.

FIG. 11 represents an example of a memory cell having a tunnel region between a channel structure 1105 of the memory cell and a charge storage region 1115, where the tunnel region includes dielectric regions 1110-1 and 1110-2. Dielectric region 1110-1 can be structured adjacent and contacting channel structure 1105, where dielectric region 1110-1 can be structured as $SiO_2$. Dielectric region 1110-2 can be structured adjacent and contacting charge storage region 1115, where dielectric region 1110-2 can be structured as SiON. The $SiO_2$ can be provided without any dopants within the $SiO_2$. $SiO_2$ has a lower dielectric constant compared to the dielectric constant of SiON. The $SiO_2$ can have a thickness that is no more than half of the SiON thickness. In other embodiments, the $SiO_2$ can have a thickness that is no more than one-third of the SiON thickness. Dielectric region 1110-2 can include a combination of multiple SiON sub-regions having different nitrogen concentrations, structured for example as shown in FIG. 1 as dielectric regions 110-1, 110-2 . . . 110-(N-1).

Figure 12:
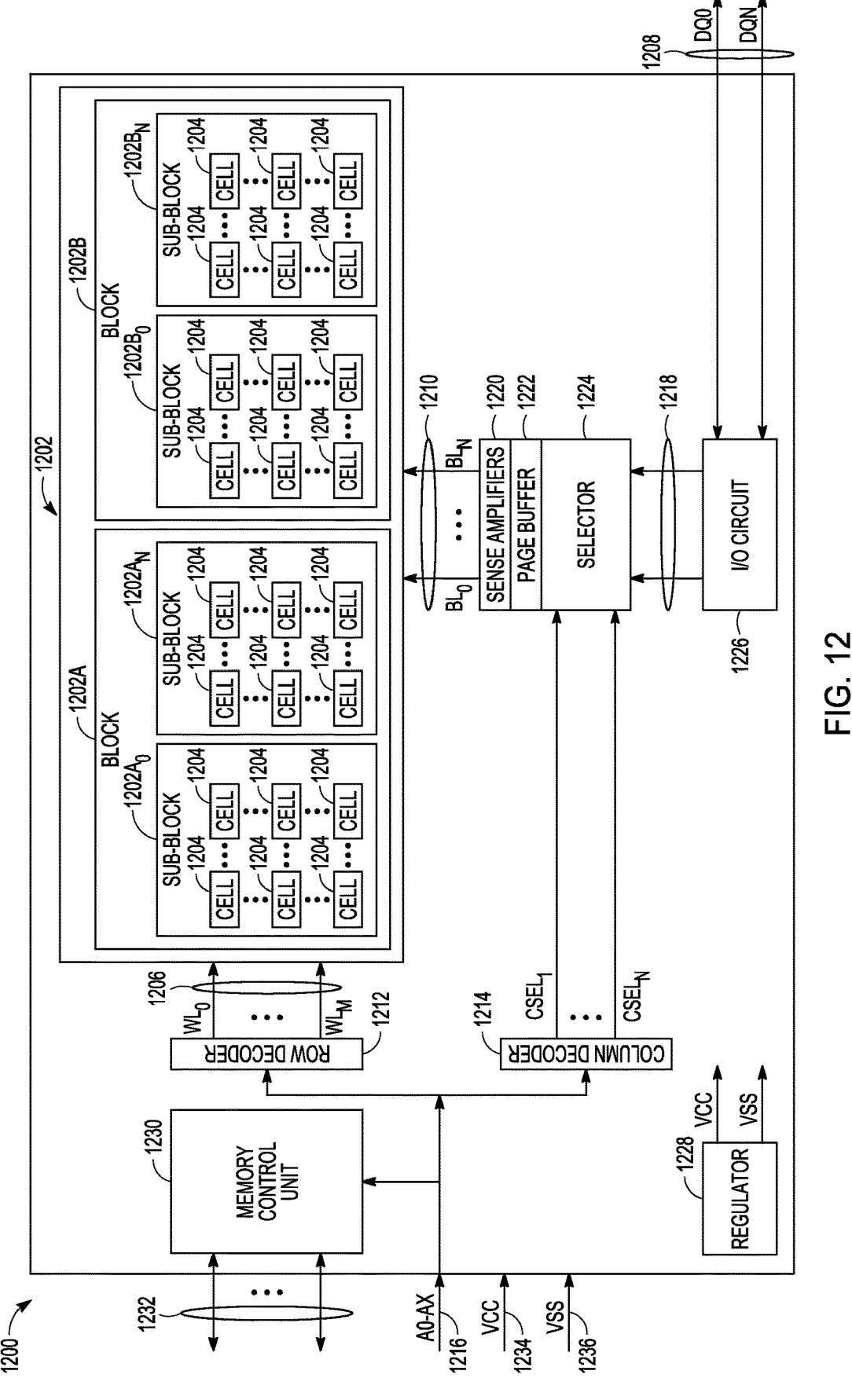
FIG. 12 illustrates a functional block diagram of an example memory device including a memory array and associated circuits, according to various embodiments.

FIG. 12 illustrates a functional block diagram of an example memory device 1200 including a memory array 1202 and associated circuits. Memory array 1202 can include a plurality of memory cells 1204 having engineered tunnel regions in a manner similar to one or a combination of the tunnel regions discussed with respect to FIGS. 1-11. However, memory cells having engineered tunnel regions in a manner similar to one or a combination of the tunnel regions discussed with respect to FIGS. 1-11 can be implemented in memory device structures other than memory device 1200. Example memory device 1200 includes one or more circuits or components to provide communication with, or perform one or more memory operations on, the memory array 1202. The memory device 1200 can include a row decoder 1212, a column decoder 1214, sense amplifiers 1220, a page buffer 1222, a selector 1224, an I/O circuit 1226, and a memory control unit 1230.

The memory cells 1204 of the memory array 1202 can be arranged in blocks, such as first and second blocks 1202A, 1202B. Each block can include sub-blocks. For example, the first block 1202A can include first and second sub-blocks 1202A₀, 1202Aₙ, and the second block 1202B can include first and second sub-blocks 1202B₀, 1202Bₙ. Each sub-

12 block can include a number of physical pages, with each page including a number of memory cells 1204. Although illustrated herein as having two blocks, with each block having two sub-blocks, and each sub-block having a number of memory cells 1204, in other examples, the memory array 1202 can include more or fewer blocks, sub-blocks, memory cells, etc. In other examples, the memory cells 1204 can be arranged in a number of rows, columns, pages, sub-blocks, blocks, etc., and accessed using, for example, access lines 1206, first data lines 1210, or one or more select gates, source lines, etc.

The memory control unit 1230 can control memory operations of the memory device 1200 according to one or more signals or instructions received on control lines 1232, including, for example, one or more clock signals or control signals that indicate a desired operation (e.g., write, read, erase, etc.), or address signals (A0-AX) received on one or more address lines 1216. One or more devices external to the memory device 1200 can control the values of the control signals on the control lines 1232 or the address signals on the address line 1216. Examples of devices external to the memory device 1200 can include, but are not limited to, a host, a memory controller, a processor, or one or more circuits or components not illustrated in FIG. 12.

The memory device 1200 can use access lines 1206 and first data lines 1210 to transfer data to (e.g., write or erase) or from (e.g., read) one or more of the memory cells 1204. The row decoder 1212 and the column decoder 1214 can receive and decode the address signals (A0-AX) from the address line 1216, can determine which of the memory cells 1204 are to be accessed, and can provide signals to one or more of the access lines 1206 (e.g., one or more of a plurality of word lines (WL0-WLm)) or the first data lines 1210 (e.g., one or more of a plurality of bit lines (BL0-BLn)), such as described above.

The memory device 1200 can include sense circuitry, such as the sense amplifiers 1220, configured to determine the values of data on (e.g., read), or to determine the values of data to be written to, the memory cells 1204 using the first data lines 1210. For example, in a selected string of memory cells 1204, one or more of the sense amplifiers 1220 can read a logic level in the selected memory cell 1204 in response to a read current flowing in the memory array 1202 through the selected string to the data lines 1210.

One or more devices external to the memory device 1200 can communicate with the memory device 1200 using the I/O lines (DQ0-DQN) 1208, address lines 1216 (A0-AX), or control lines 1232. The I/O circuit 1226 can transfer values of data in or out of the memory device 1200, such as in or out of the page buffer 1222 or the memory array 1202, using the I/O lines 1208, according to, for example, the control lines 1232 and address lines 1216. The page buffer 1222 can store data received from the one or more devices external to the memory device 1200 before the data is programmed into relevant portions of the memory array 1202, or can store data read from the memory array 1202 before the data is transmitted to the one or more devices external to the memory device 1200.

The column decoder 1214 can receive and decode address signals (A0-AX) into one or more column select signals (CSEL1-CSELn). The selector 1224 (e.g., a select circuit) can receive the column select signals (CSEL1-CSELn) and select data in the page buffer 1222 representing values of data to be read from or to be programmed into memory cells 1204. Selected data can be transferred between the page buffer 1222 and the I/O circuit 1226 using second data lines 1218. The memory control unit 1230 can receive positive and negative supply signals, such as a supply voltage (VCCx) 1234 and a negative supply (VSS) 1236 (e.g., a ground potential), from an external source or supply (e.g., an internal or external battery, an AC-to-DC converter, etc.). In certain examples, the memory control unit 1230 can include a regulator 1228 to internally provide positive or negative supply signals.

FIG. 13 is an embodiment of an example method 1300 of forming a memory device. Forming the memory device can include forming one or more memory cells. Each memory cell of an array of the memory device can be formed in a common procedure. Various approaches can be taken in forming the memory device such that the elements in the following procedure can be performed in a different order. At 1310, a channel structure is formed. The channel structure can be formed as a vertical polysilicon structure capable of conducting a current in operation of the memory device. At 1320, a charge storage region for the memory cell is formed. The charge storage region can be a nitride region, such as but not limited to, silicon nitride.

At 1330, a tunneling region having multiple regions is formed such that the tunneling region is located between the channel structure and the charge storage region in the completed memory device. The tunneling region can be formed as multiple dielectric regions, which have characteristics that provide a modulation of the dielectric constant across the tunnel region. At 1340, in forming the tunneling region, a first dielectric region is formed adjacent to and contacting the channel structure, where material of the first dielectric region is different from silicon oxide and has a dielectric constant less than that of silicon nitride. The first dielectric region can be formed with a composition having the lowest dielectric constant of the multiple regions of the tunnel region. At 1350, in forming the tunneling region, a second dielectric region is formed between the first dielectric region and the charge storage region, with the second dielectric region having a dielectric constant greater than that of silicon nitride. Forming the elements of the memory cells can be performed using fabrication techniques such as, but not limited to, chemical vapor deposition of atomic layer deposition.

Variations of method 1300 or methods similar to method 1300 can include a number of different embodiments that may be combined depending on the application of such methods and/or the architecture of memory devices for which such methods are implemented. Such methods can include forming a third dielectric region between the first dielectric region and the second dielectric region, where material of the third dielectric is doped SiON having a different compositional content from the material of the first dielectric region. The first dielectric region can be formed including forming SiON doped with carbon or boron and the doped SiON of the third dielectric region can be formed including doped with carbon or boron with the third dielectric region having a different nitrogen content than the first dielectric region.

Variations of method 1300 or methods similar to method 1300 can include forming the second dielectric region adjacent to and contacting the first dielectric region and forming a third dielectric region and a fourth dielectric region between the second dielectric region and the charge storage region. Material of the third dielectric region and material of the fourth dielectric region are selected to have dielectric constants different from each other and less than that of silicon nitride.

Variations of method 1300 or methods similar to method 1300 can include forming the second dielectric region adjacent to and contacting the first dielectric region; forming a third dielectric region adjacent to and contacting the second dielectric region; and forming a fourth dielectric region between the third dielectric region and the charge storage region. The third dielectric region can be formed having a dielectric constant greater than that of silicon nitride, such that the dielectric constants of the second dielectric region and the third dielectric region are different from each other. The fourth dielectric region can be formed having a dielectric constant less than that of silicon nitride.

Variations of method 1300 or methods similar to method 1300 can include forming the multiple regions with dielectric non-metal oxide regions with material of each dielectric non-metal oxide region including SiO(C, B)N. The SiO(C, B)N in different dielectric non-metal oxide regions can have a different nitrogen profile or a different doping profile. Variations of method 1300 can include forming the second dielectric region by forming a metal oxide. The metal oxide can be formed as a dielectric single metal oxide or a dielectric double metal oxide. Composition of the metal oxide can include one or more of hafnium, zirconium, or aluminum. Other metals can be used in forming the metal oxides. Variations of method 1300 or methods similar to method 1300 can include forming the memory cell along with multiple memory cells in a vertical structure, with portions of the channel structure and portions of the tunneling region common to the multiple memory cells.

FIG. 14 is an embodiment of another example method 1400 of forming a memory device. Forming the memory device can include forming one or more memory cells. Each memory cell of an array of the memory device can be formed in a common procedure. Various approaches can be taken in forming the memory device such that the elements in the following procedure can be performed in a different order. At 1410, a channel structure is formed. The channel structure can be formed as a vertical polysilicon structure capable of conducting a current in operation of the memory device. At 1420, a charge storage region for the memory cell is formed. The charge storage region can be a nitride region, such as, but not limited to, silicon nitride.

At 1430, a tunneling region having multiple regions is formed such that the tunneling region is located between the channel structure and the charge storage region in the completed memory device. At 1440, in forming the tunneling region, a first dielectric region having deep charge traps is formed adjacent to and contacting the charge storage region. Deep traps can be formed by doping. For example, SiON can be doped with C, B, or C and B. Other dopants can be used, such as, but not limited to, Hf, Al, or Zr. Forming the tunneling region as multiple dielectric regions can include forming a doped dielectric region in addition to forming the first dielectric region. Forming the elements of the memory cells can be performed using fabrication techniques such as but not limited to chemical vapor deposition of atomic layer depositon.

Variations of method 1400 or methods similar to method 1400 can include a number of different embodiments that may be combined depending on the application of such methods and/or the architecture of memory devices for which such methods are implemented. Such methods can include, with respect to a doped dielectric region in addition to forming the first dielectric, forming the doped dielectric region having a varying concentration of a dopant and forming the doped dielectric adjacent and contacting the channel structure. The dielectric having a varying concentration of a dopant can include SiO(C)N. The SiO(C)N can also have a varying concentration of nitrogen in the doped dielectric region. Alternatively, SiON with a varying concentration of nitrogen can be formed in place of SiO(C)N. Variations can include forming the tunneling region as multiple dielectric regions by forming a second doped dielectric region in addition to the doped dielectric region and the first dielectric region. The second doped dielectric region can have a nitrogen content or a dopant content different from that of the doped dielectric region.

Variations of such methods can include, with respect to a doped dielectric region in addition to forming the first dielectric region, forming the tunneling region as multiple dielectric regions to include forming a second doped dielectric region and a third doped dielectric region in addition to the doped dielectric region and the first dielectric region. Each of the second doped dielectric region and the third doped dielectric region can have a different nitrogen content than the doped dielectric region, where the second doped dielectric region has a different nitrogen content than the third doped dielectric region.

Variations of such methods can include forming the tunneling region as multiple dielectric regions with the first dielectric region having deep charge traps by forming SiON having deep charge traps. The SiON having deep charge traps can be formed by doping the SiON with carbon or boron to a dopant level to generate the deep charge traps. SiOCN can be cured with oxygen containing gas such as $N_2O$, NO, $O_2$, $H_2O$, $H_2$, or $O_2$ and $H_2$. Curing is a process during which a chemical or physical reaction occurs, resulting in a harder, tougher or more stable linkage of bonds or harder, tougher substance. Curing can be performed to reduce the presence of shallow traps. Curing can include plasma treatment with $N_2$, $NH_3$, or combinations thereof. Other dielectrics formed in the tunnel region can be cured in a similar manner.

Figure 15:
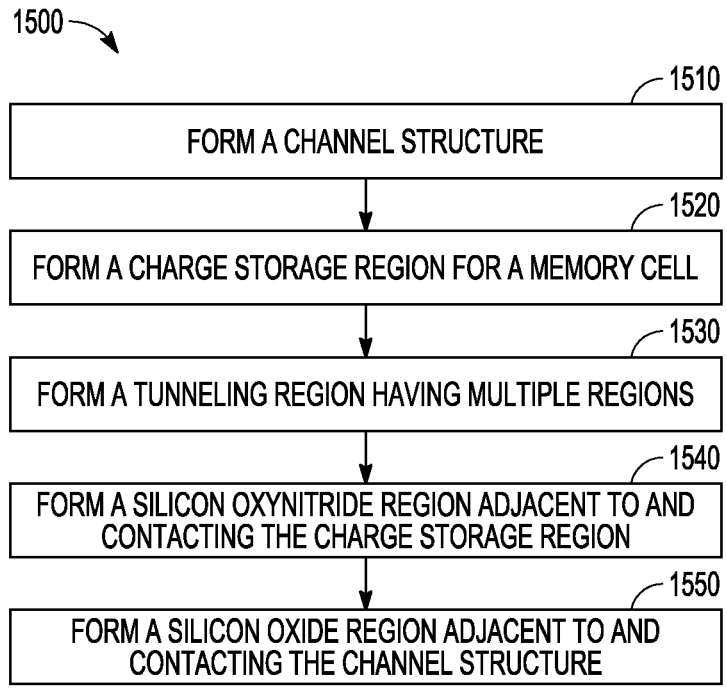
FIG. 15 is a flow diagram of features of another example method of forming a memory device, in accordance with various embodiments.

FIG. 15 is an embodiment of another example method 1500 of forming a memory device. Forming the memory device can include forming one or more memory cells. Each memory cell of an array of the memory device can be formed in a common procedure. Various approaches can be taken in forming the memory device such that the elements in the following procedure can be performed in a different order. At 1510, a channel structure is formed. The channel structure can be formed as a vertical polysilicon structure capable of conducting a current in operation of the memory device. At 1520, a charge storage region for the memory cell is formed. At 1530, a tunnel region having multiple regions is formed such that the tunneling region is located between the channel structure and the charge storage region in the completed memory device. At 1540, in forming the tunnel region, a SiON region is formed adjacent to and contacting the charge storage region. At 1550, in forming the tunnel region, a silicon oxide region is formed adjacent to and contacting the channel structure. Forming the elements of the memory cells can be performed using fabrication techniques such as but not limited to chemical vapor deposition or atomic layer depositon.

Variations of method 1500 or methods similar to method 1500 can include a number of different embodiments that may be combined depending on the application of such methods and/or the architecture of memory devices for which such methods are implemented. Such methods can include forming $SiO_2$ having a thickness equal to or less than one-half of a thickness of the SiON region. Variations can include forming $SiO_2$ having a thickness equal to or less than one-third of a thickness of the SiON region.

Variations of method 1500 or methods similar to method 1500 can include forming the SiON region to have an arrangement of multiple sub-regions of SiON having different nitrogen concentrations. Variations can include forming the charge storage region to include silicon nitride and forming the channel structure to include polysilicon.

In various embodiments, a memory device can comprise an array of memory cells, with each memory cell having a charge storage region separated from a channel structure by a tunnel region, where the tunnel region has multiple regions such that the tunnel region has a dielectric constant modulation. The multiple regions of the tunnel region can include a first dielectric region and one or more additional dielectric regions. The first dielectric region can be adjacent to and contacting the channel structure. Material of the first dielectric region is different from silicon oxide and has a dielectric constant less than that of silicon nitride. The one or more additional dielectric regions can be arranged between the first dielectric region and the charge storage region, where the one or more additional dielectric regions include a second dielectric region having a dielectric constant greater than that of silicon nitride. The first dielectric region can have the lowest dielectric constant of the multiple regions of the tunnel region.

Variations of such a memory device and its features, as taught herein, can include a number of different embodiments and features that may be combined depending on the application of such memory devices, the format of such memory devices, and/or the architecture in which such memory devices are implemented. Features of such memory devices can include the one or more additional dielectric regions structured having a third dielectric region between the first dielectric region and the second dielectric region. Material of the third dielectric region can include a doped SiON having a different compositional content from the material of the first dielectric region. The first dielectric region can include SiO(C,B)N and the doped SiON of the third dielectric region can be doped with carbon or boron, where the third dielectric region has a different nitrogen content than the first dielectric region.

Variations of such a memory device, with the tunnel region including the first dielectric region and the second dielectric region, can include the second dielectric region being adjacent to and contacting the first dielectric region. The one or more additional dielectric regions can include a third dielectric region and a fourth dielectric region between the second dielectric region and the charge storage region. Dielectric constants of the third dielectric region and the fourth dielectric region can be different from each other and less than that of silicon nitride.

Variations of such a memory device, with the tunnel region including the first dielectric region and the second dielectric region, can include the second dielectric region being adjacent to and contacting the first dielectric region and the one or more additional dielectric regions can include a third dielectric region and a fourth dielectric region. The third dielectric region can have a dielectric constant greater than that of silicon nitride and can be located adjacent to and contacting the second dielectric region. Dielectric constants of the second dielectric region and the third dielectric region can be different from each other. The fourth dielectric region can be arranged between the third dielectric region and the charge storage region, where the fourth dielectric region has a dielectric constant less than that of silicon nitride.

Variations of such a memory device, with the tunnel region including the first dielectric region and the one or more additional dielectric regions, can include the one or more additional dielectric regions having dielectric nonmetal oxide regions with material of each dielectric nonmetal oxide region including SiO(C, B)N. SiON in different dielectric non-metal oxide regions can have a different nitrogen profile or a different doping profile from SiONs in other dielectric non-metal oxide regions. Other variations of such a memory device can include the second dielectric region containing a metal oxide. Material of the second dielectric region can include a dielectric single metal oxide or a dielectric double metal oxide. The metal in the single metal oxide or double metal oxide can include one or more of hafnium, zirconium, or aluminum.

In various embodiments, a second memory device can comprise an array of memory cells, with each memory cell having a charge storage region separated from a channel structure by a tunnel region. The tunnel region can have multiple regions including a first dielectric region and one or more additional dielectric regions such that the tunnel region has a trap level modulation. The first dielectric region having deep charge traps can be arranged adjacent to and contacting the charge storage region. The one or more additional dielectric regions are arranged between the first dielectric region and the channel structure. The one or more additional dielectric regions can include a doped dielectric region. The doped dielectric region can include a dielectric having a varying concentration of a dopant. The dielectric having a varying concentration of a dopant can include SiON doped with carbon, where the SiON has a varying concentration of nitrogen in the doped dielectric region.

Variations of such a second memory device and its features, as taught herein, can include a number of different embodiments and features that may be combined depending on the application of such memory devices, the format of such memory devices, and/or the architecture in which such memory devices are implemented. Features of such memory devices can include the one or more additional dielectric regions having a second doped dielectric region, where the second doped dielectric region has a different nitrogen content than the doped dielectric region.

Variations of such a second memory device, with the tunnel region including the first dielectric region and the doped dielectric region, can include a second doped dielectric region and a third doped dielectric region, where each of the second doped dielectric region and the third doped dielectric region has a different nitrogen content than the doped dielectric region. The second doped dielectric region can have a different nitrogen content than the third doped dielectric region.

Variations of such a second memory device, with the tunnel region including the first dielectric region and the doped dielectric region, the first dielectric region can include SiON having deep charge traps. The deep charge traps can be associated with silicon oxynitride doped with carbon or boron at a dopant level to generate the deep charge traps.

In various embodiments, a third memory device can comprise an array of memory cells, with each memory cell having a charge storage region separated from a channel structure by a tunnel region. The tunnel region can have multiple regions. The multiple regions can include a silicon oxide region adjacent to and contacting the charge storage region and a SiON region adjacent to and contacting the channel structure. The silicon oxide region can be structured as $SiO_2$ without elements other than silicon and oxygen.

Variations of such a third memory device and its features, as taught herein, can include a number of different embodiments and features that may be combined depending on the application of such memory devices, the format of such memory devices, and/or the architecture in which such memory devices are implemented. Features of such memory devices can include the silicon oxide region having a thickness equal to or less than one-half of a thickness of the SiON region. Variations of the third memory device can include the silicon oxide region having a thickness equal to or less than one-third of a thickness of the SiON region. Variations of the third memory device can include the SiON region having multiple sub-regions of silicon oxynitride having different nitrogen concentrations. Variations of the third memory device can include structuring the charge storage region with silicon nitride and structuring the channel structure with polysilicon.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. In addition, electronic devices can be broken down into several main components: a processor (e.g., a central processing unit (CPU) or other main processor); memory (e.g., one or more volatile or non-volatile RAM memory devices, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 16:
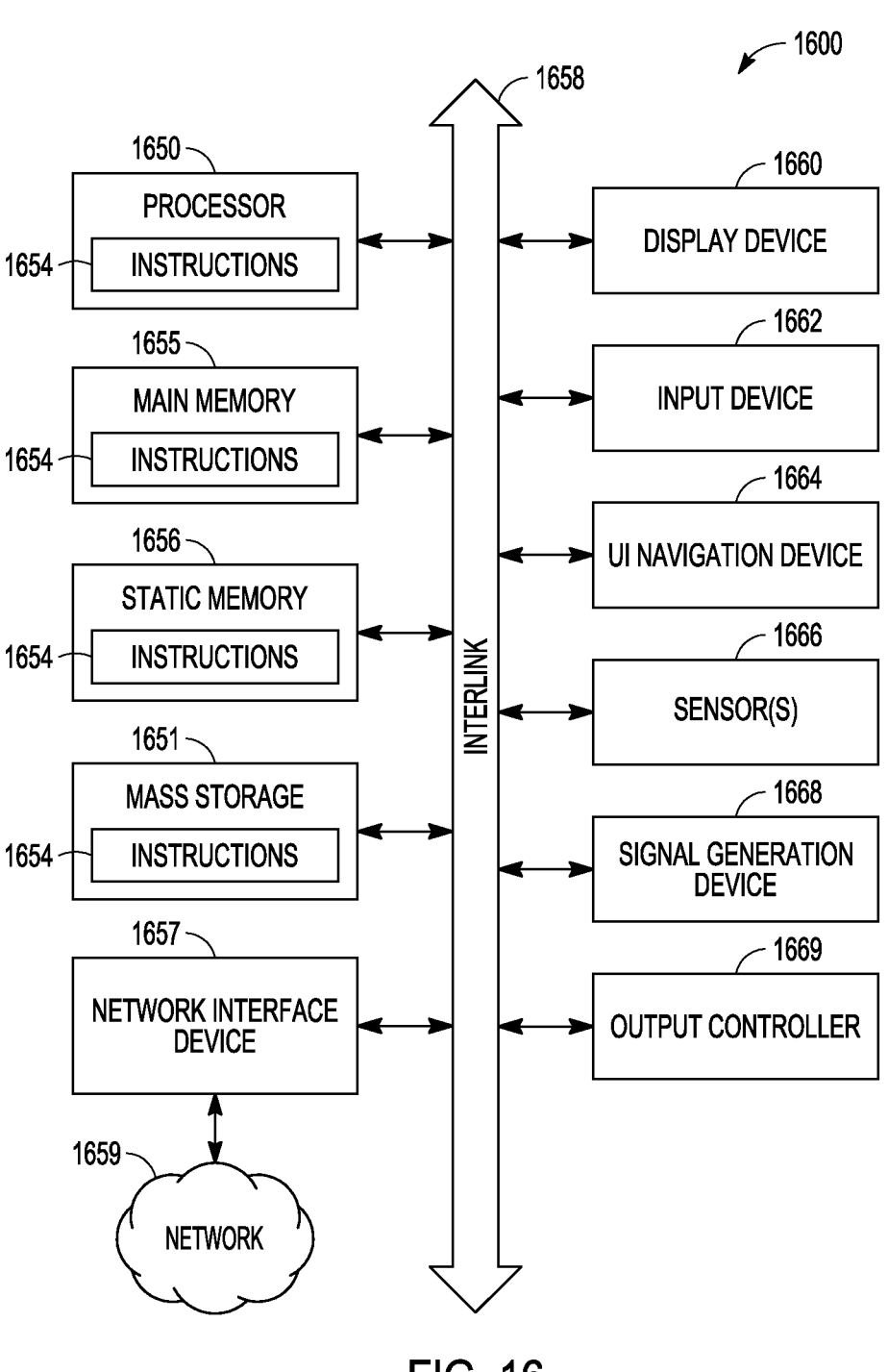
FIG. 16 is a block diagram illustrating an example of a machine in which one or more memory devices may be implemented, in accordance with various embodiments.

FIG. 16 illustrates a block diagram of an example machine 1600 upon which any one or more of the techniques (e.g., methodologies) or structures discussed herein may be implemented having one or more memory devices structured with memory cells having tunnel regions with a varying dielectric constant across the tunnel region as discussed with respect to FIGS. 1-15. In alternative embodiments, machine 1600 may operate as a standalone device or may be connected (e.g., networked) to other machines. In a networked deployment, machine 1600 may operate in the capacity of a server machine, a client machine, or both in server-client network environments. In an example, machine 1600 may act as a peer machine in peer-to-peer (P2P) (or other distributed) network environment. Machine 1600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform one or more methodologies, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation.

Machine 1600 may include a hardware processor 1650 (e.g., a CPU, a GPU, a hardware processor core, or any combination thereof), a main memory 1655, and a static memory 1656, some or all of which can communicate with each other via an interlink 1658 (e.g., bus). Machine 1600 can include a display device 1660, an input device 1662, which can be an alphanumeric input device (e.g., a keyboard), and a user interface (UI) navigation device 1664 (e.g., a mouse). In an example, display device 1660, input device 1662, and UI navigation device 1664 can be a touch screen display. Machine 1600 can additionally include a mass storage device (e.g., drive unit) 1651, a signal generation device 1668, a network interface device 1657, and one or more sensors 1666, such as a global positioning system (GPS) sensor, compass, accelerometer, or other sensor. Machine 1600 may include an output controller 1669, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 1600 can store one or more sets of data structures or instructions 1654 (e.g., software) embodying or utilized by machine 1600 to perform any one or more of the techniques or functions for which machine 1600 is designed. Instructions 1654 may also reside, completely or at least partially, within main memory 1655, within static memory 1656, or within hardware processor 1650 during execution thereof by machine 1600.

Instructions 1654 (e.g., software, programs, an operating system (OS), etc.) or other data can be stored on mass storage device 1651 or can be accessed by main memory 1655 for use by hardware processor 1650. Main memory 1655 (e.g., DRAM) is typically fast, but volatile, and thus a different type of storage than mass storage device 1651 (e.g., an SSD), which is suitable for long-term storage, including while in an "off" condition. Instructions 1654 or data in use by a user or machine 1600 are typically loaded in main memory 1655 for use by hardware processor 1650. When main memory 1655 is full, virtual space from mass storage device 1651 can be allocated to supplement main memory 1655; however, because mass storage device 1651 is typically slower than main memory 1655, and write speeds are typically at least twice as slow as read speeds, use of virtual memory can greatly reduce user experience due to storage device latency (in contrast to main memory 1655, e.g., DRAM). Further, use of mass storage device 1651 for virtual memory can greatly reduce the usable lifespan of mass storage device 1651.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 1654 can be transmitted or received over a network 1659 using a transmission medium via signal generation device 1668 or network interface device 1657 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, signal generation device 1668 or network interface device 1657 may include one or more physical jacks (e.g., Ethernet, coaxial, or phone jacks) or one or more antennas to connect to network 1659. In an example, signal generation device 1668 or network interface device 1657 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 1600, and includes instrumentalities to propagate digital or analog communications signals to facilitate communication of such instructions, which instructions may be implemented by software.

The following are example embodiments of methods and electronic devices, in accordance with the teachings herein.

An example memory device 1 can comprise: an array of memory cells, each memory cell having a charge storage region separated from a channel structure by a tunnel region, the tunnel region having multiple regions including: a first dielectric region adjacent to and contacting the channel structure, material of the first dielectric region being different from silicon oxide and having a dielectric constant less than that of silicon nitride; one or more additional dielectric regions between the first dielectric region and the charge storage region, the one or more additional dielectric regions including a second dielectric region having a dielectric constant greater than that of silicon nitride.

An example memory device 2 can include features of example memory device 1 and can include the first dielectric region having a lowest dielectric constant of the multiple regions of the tunnel region.

An example memory device 3 can include features of any of the preceding example memory devices and can include the one or more additional dielectric regions to include a third dielectric region between the first dielectric region and the second dielectric region, material of the third dielectric region being a doped SiON having a different compositional content from the material of the first dielectric region.

An example memory device 4 can include features of example memory device 3 and any of the preceding example memory devices and can include the first dielectric region to include SiON doped with carbon or boron and the doped SiON of the third dielectric region is doped with carbon or boron, the third dielectric region having a different nitrogen content than the first dielectric region.

An example memory device 5 can include features of any of the preceding example memory devices and can include the second dielectric region is adjacent to and contacts the first dielectric region and the one or more additional dielectric regions includes a third dielectric region and a fourth dielectric region between the second dielectric region and the charge storage region, dielectric constants of the third dielectric region and the fourth dielectric region being different from each other and less than that of silicon nitride.

An example memory device 6 can include features of any of the preceding example memory devices and can include the second dielectric region being adjacent to and contacting the first dielectric region; and the one or more additional dielectric regions to include: a third dielectric region having a dielectric constant greater than that of silicon nitride, the third dielectric region being adjacent to and contacting the second dielectric region, dielectric constants of the second dielectric region and the third dielectric region being different from each other; and a fourth dielectric region between the third dielectric region and the charge storage region, the fourth dielectric region having a dielectric constant less than that of silicon nitride.

An example memory device 7 can include features of any of the preceding example memory devices and can include the one or more additional dielectric regions to include dielectric non-metal oxide regions with material of each dielectric non-metal oxide region including SiON doped with carbon or boron, with SiON in different dielectric non-metal oxide regions having a different nitrogen profile or a different doping profile.

An example memory device 8 can include features of any of the preceding example memory devices and can include the second dielectric region to include a metal oxide.

An example memory device 9 can include features of example memory device 8 and any of the preceding example memory devices and can include material of the second dielectric region to include a dielectric single metal oxide or a dielectric double metal oxide.

An example memory device 10 can include features of example memory device 9 and any of the preceding example memory devices and can include metal in the single metal oxide or double metal oxide includes one or more of hafnium, zirconium, or aluminum.

In an example memory device 11, any of the memory devices of example memory devices 1 to 10 may include memory devices incorporated into an electronic memory apparatus further comprising a host processor and a communication bus extending between the host processor and the memory device.

In an example memory device 12, any of the memory devices of example memory devices 1 to 11 may be modified to include any structure presented in another of example memory device 1 to 11.

In an example memory device 13, any of the memory devices of example memory devices 1 to 12 may be modified to include any structure presented in another of example memory device 1 to 12.

In an example memory device 14, any apparatus associated with the memory devices of example memory devices 1 to 13 may further include a machine-readable storage device configured to store instructions as a physical state, wherein the instructions may be used to perform one or more operations of the apparatus.

In an example memory device 15, any of the memory devices of example memory devices 1 to 14 may be operated in accordance with any of the methods of the below example methods 1 to 36.

An example memory device 16 can comprise an array of memory cells, each memory cell having a charge storage region separated from a channel structure by a tunnel region, the tunnel region having multiple regions including: a first dielectric region having deep charge traps, the first dielectric region adjacent to and contacting the charge storage region; and one or more additional dielectric regions between the first dielectric region and the channel structure, the one or more additional dielectric regions including a doped dielectric region.

An example memory device 17 can include features of example memory device 16 and can include the doped dielectric region having a dielectric having a varying concentration of a dopant.

An example memory device 18 can include features of example memory device 17 and any of the preceding example memory device 16 and can include the dielectric having a varying concentration of a dopant having SiON doped with carbon, the SiON having a varying concentration of nitrogen in the doped dielectric region.

An example memory device 19 can include features of any of the preceding example memory devices 16 to 18 and can include the one or more additional dielectric regions having a second doped dielectric region, the second doped dielectric region having a different nitrogen content than the doped dielectric region.

An example memory device 20 can include features of any of the preceding example memory devices 16 to 19 and can include the one or more additional dielectric regions to include a second doped dielectric region and a third doped dielectric region, each of the second doped dielectric region and the third doped dielectric region having a different nitrogen content than the doped dielectric region, the second doped dielectric region having a different nitrogen content than the third doped dielectric region.

An example memory device 21 can include features of any of the preceding example memory devices 16 to 20 and can include the first dielectric region having SiON having deep charge traps.

An example memory device 22 can include features of example memory device 21 and any of the preceding example memory devices 16 to 20 and can include the deep charge traps being associated with SiON doped with carbon or boron at a dopant level to generate the deep charge traps.

In an example memory device 23, any of the memory devices of example memory devices 16 to 22 may include memory devices incorporated into an electronic memory apparatus further comprising a host processor and a communication bus extending between the host processor and the memory device.

In an example memory device 24, any of the memory devices of example memory devices 16 to 23 may be modified to include any structure presented in another of example memory device 16 to 23.

In an example memory device 25, any of apparatus associated with the memory devices of example memory devices 16 to 24 may further include a machine-readable storage device configured to store instructions as a physical state, wherein the instructions may be used to perform one or more operations of the apparatus.

In an example memory device 26, any of the memory devices of example memory devices 16 to 25 may be operated in accordance with any of the methods of the following example methods 1 to 36.

An example memory device 27 can comprise: an array of memory cells, each memory cell having a charge storage region separated from a channel structure by a tunnel region, the tunnel region having multiple regions including: a SiON region adjacent to and contacting the charge storage region; and a silicon oxide region adjacent to and contacting the channel structure.

An example memory device 28 can include features of example memory device 27 and can include the silicon oxide region having a thickness equal to or less than one-half of a thickness of the SiON region.

An example memory device 29 can include features of any of the preceding example memory devices 27 to 28 and can include the silicon oxide region having a thickness equal to or less than one-third of a thickness of the SiON region.

An example memory device 30 can include features of any of the preceding example memory devices 27 to 29 and can include the SiON region having multiple sub-regions of SiON having different nitrogen concentrations.

An example memory device 31 can include features of any of the preceding example memory devices 27 to 30 and can include the charge storage region having silicon nitride and the channel structure including polysilicon.

In an example memory device 32, any of the memory devices of example memory devices 27 to 31 may include memory devices incorporated into an electronic memory apparatus further comprising a host processor and a communication bus extending between the host processor and the memory device.

In an example memory device 33, any of the memory devices of example memory devices 27 to 32 may be modified to include any structure presented in another of example memory device 27 to 32.

In an example memory device 34, any of apparatus associated with the memory devices of example memory devices 27 to 33 may further include a machine-readable storage device configured to store instructions as a physical state, wherein the instructions may be used to perform one or more operations of the apparatus.

In an example memory device 35, any of the memory devices of example memory devices 25 to 32 may be operated in accordance with any of the methods of the following example methods 1 to 36.

An example method 1 of forming a memory device, the method can comprise forming a memory cell of an array of the memory device, including: forming a channel structure; forming a charge storage region for the memory cell; and forming a tunneling region having multiple regions, such that the tunneling region is located between the channel structure and the charge storage region in the completed memory device, including: forming a first dielectric region adjacent to and contacting the channel structure, material of the first dielectric region being different from silicon oxide and having a dielectric constant less than that of silicon nitride; and forming a second dielectric region between the first dielectric region and the charge storage region, the second dielectric region having a dielectric constant greater than that of silicon nitride.

An example method 2 of forming a memory device can include features of example method 1 of forming a memory device and can include forming the first dielectric region to include forming the first dielectric region with a composition having a lowest dielectric constant of the multiple regions of the tunnel region.

An example method 3 of forming a memory device can include features of any of the preceding example methods of forming a memory device and can include forming a third dielectric region between the first dielectric region and the second dielectric region, material of the third dielectric being a doped SiON having a different compositional content from the material of the first dielectric region.

An example method 4 of forming a memory device can include features of example method 3 of forming a memory device and any of the preceding example methods of forming a memory device and can include forming the first dielectric region to include forming SiON doped with carbon or boron and forming the doped SiON of the third dielectric region doped with carbon or boron having a different nitrogen content than the first dielectric region.

An example method 5 of forming a memory device can include features of any of the preceding example methods of forming a memory device and can include forming the second dielectric region adjacent to and contacting the first dielectric region and forming a third dielectric region and a fourth dielectric region between the second dielectric region and the charge storage region with material of the third dielectric region and material of the fourth dielectric region having dielectric constants different from each other and less than that of silicon nitride.

An example method 6 of forming a memory device can include any of the preceding example methods of forming a memory device and can include forming the second dielectric region adjacent to and contacting the first dielectric region; forming a third dielectric region adjacent to and contacting the second dielectric region and forming the third dielectric region having a dielectric constant greater than that of silicon nitride, such that the dielectric constants of the second dielectric region and the third dielectric region are different from each other; and forming a fourth dielectric region between the third dielectric region and the charge storage region, and forming the fourth dielectric region having a dielectric constant less than that of silicon nitride.

An example method 7 of forming a memory device can include features of any of the preceding example methods of forming a memory device and can include forming the multiple regions to include forming dielectric non-metal oxide regions with material of each dielectric non-metal oxide region including SiON doped with carbon or boron, with SiON in different dielectric non-metal oxide regions having a different nitrogen profile or a different doping profile.

An example method 8 of forming a memory device can include features of any of the preceding example methods of forming a memory device and can include forming the second dielectric region to include forming a metal oxide.

An example method 9 of forming a memory device can include features of example method 8 of forming a memory device and any of the preceding example methods of forming a memory device and can include forming the metal oxide to include forming a dielectric single metal oxide or forming a dielectric double metal oxide.

An example method 10 of forming a memory device can include features of example method 9 of forming a memory device and any of the preceding example methods of forming a memory device and can include composition of the metal oxide to include one or more of hafnium, zirconium, or aluminum.

An example method 11 of forming a memory device can include features of any of the preceding example methods of forming a memory device and can include forming the memory cell along with multiple memory cells in a vertical structure, with portions of the channel structure and portions of the tunneling region common to the multiple memory cells.

In an example method 12 of forming a memory device, any of the example methods 1 to 11 of forming a memory device may be performed for forming an electronic memory apparatus further comprising forming a host processor and a communication bus extending between the host processor and the memory device.

In an example method 13 of forming a memory device, any of the example methods 1 to 12 of forming a memory device may be modified to include operations set forth in any other of method examples 1 to 12.

In an example method 14 of forming a memory device, any of the example methods 1 to 13 of forming a memory device may be implemented at least in part through use of instructions stored as a physical state in one or more machine-readable storage devices.

An example method 15 of forming a memory device can include features of any of the preceding example methods 1 to 14 of forming a memory device and can include forming the memory device to perform functions associated with any features of example memory devices 1 to 35.

An example method 16 of forming a memory device, the method can comprise forming a memory cell of an array of the memory device, including: forming a channel structure; forming a charge storage region for the memory cell; and forming a tunneling region such that the tunneling region is located between the channel structure and the charge storage region in the completed memory device, including forming the tunneling region as multiple dielectric regions with a first dielectric region having deep charge traps, the first dielectric region formed adjacent to and contacting the charge storage region.

An example method 17 of forming a memory device can include features of example method 16 of forming a memory device and can include forming the tunneling region as multiple dielectric regions to include forming a doped dielectric region in addition to the first dielectric region.

An example method 18 of forming a memory device can include features of example method 17 of forming a memory device and any of the preceding example methods of forming a memory device and can include forming the doped dielectric region to include forming the doped dielectric region having a varying concentration of a dopant and forming the doped dielectric region adjacent and contacting the channel structure.

An example method 19 of forming a memory device can include features of example method 18 of forming a memory device and any of the preceding example methods of forming a memory device and can include the dielectric having a varying concentration of a dopant to include SiON doped with carbon, the SiON having a varying concentration of nitrogen in the doped dielectric region.

An example method 20 of forming a memory device can include features of example method 17 of forming a memory device and any of the preceding example methods of forming a memory device and can include forming the tunneling region as multiple dielectric regions to include forming a second doped dielectric region in addition to the doped dielectric region and the first dielectric region, the second doped dielectric region having a nitrogen content or a dopant content different from that of the doped dielectric region.

An example method 21 of forming a memory device can include features of example method 5 of forming a memory device and any of the preceding example methods of forming a memory device and can include forming the tunneling region as multiple dielectric regions to include forming a second doped dielectric region and a third doped dielectric region in addition to the doped dielectric region and the first dielectric region, with each of the second doped dielectric region and the third doped dielectric region having a different nitrogen content than the doped dielectric region, the second doped dielectric region having a different nitrogen content than the third doped dielectric region.

An example method 22 of forming a memory device can include features of example method 16 of forming a memory device and any of the preceding example methods of forming a memory device and can include forming the tunneling region as multiple dielectric regions with the first dielectric region having deep charge traps to include forming SiON having deep charge traps.

An example method 23 of forming a memory device can include features of example method 3 of forming a memory device and any of the preceding example methods of forming a memory device and can include forming SiON having deep charge traps to include doping the SiON with carbon or boron to a dopant level to generate the deep charge traps.

In an example method 24 of forming a memory device, any of the example methods 16 to 23 of forming a memory device may be performed for forming an electronic memory apparatus further comprising forming a host processor and a communication bus extending between the host processor and the memory device.

In an example method 25 of forming a memory device, any of the example methods 16 to 24 of forming a memory device may be modified to include operations set forth in any other of method examples 16 to 24.

In an example method 26 of forming a memory device, any of the example methods 16 to 25 of forming a memory device may be implemented at least in part through use of instructions stored as a physical state in one or more machine-readable storage devices.

An example method 27 of forming a memory device can include features of any of the preceding example methods 16 to 26 of forming a memory device and can include forming the memory device to perform functions associated with any features performing functions associated with any features of example memory devices 1 to 35.

An example method 28 of forming a memory device can comprise forming a memory cell of an array of the memory device, including: forming a channel structure; forming a charge storage region for the memory cell; and forming a tunneling region such that the tunneling region is located between the channel structure and the charge storage region in the completed memory device, forming the tunneling region including forming a SiON region adjacent to and contacting the charge storage region; and forming a silicon oxide region adjacent to and contacting the channel structure.

An example method 29 of forming a memory device can include features of example method 28 of forming a memory device and can include forming the silicon oxide region to include forming the silicon oxide having a thickness equal to or less than one-half of a thickness of the SiON region.

An example method 30 of forming a memory device can include features of any of the preceding example methods 28 to 29 of forming a memory device and can include forming the silicon oxide region to include forming the silicon oxide having a thickness equal to or less than one-third of a thickness of the SiON region.

An example method 31 of forming a memory device can include features of any of the preceding example methods 28 to 30 of forming a memory device and can include the SiON region including multiple sub-regions of SiON having different nitrogen concentrations.

An example method 32 of forming a memory device can include features of any of the preceding example methods 28 to 31 of forming a memory device and can include the charge storage region including silicon nitride and the channel structure including polysilicon.

In an example method 33 of forming a memory device, any of the example methods 28 to 32 of forming a memory device may be performed for forming an electronic memory apparatus further comprising forming a host processor and a communication bus extending between the host processor and the memory device.

In an example method 34 of forming a memory device, any of the example methods 28 to 33 of forming a memory device may be modified to include operations set forth in any other of method examples 28 to 33.

In an example method 35 of forming a memory device, any of the example methods 28 to 34 of forming a memory device may be implemented at least in part through use of instructions stored as a physical state in one or more machine-readable storage devices.

An example method 36 of forming a memory device can include features of any of the preceding example methods 28 to 35 of forming a memory device and can include forming the memory device to perform functions associated with any features of example memory devices 1 to 35.

An example machine-readable storage device 1 storing instructions, that when executed by one or more processors, cause a machine to perform operations associated with any features of example memory devices 1 to 35 or perform methods associated with any features of example methods 1 to 36.

Although specific embodiments have been illustrated and described herein, any arrangement that is calculated to achieve the same purpose may be substituted for the specific embodiments shown. Various embodiments can use permutations and/or combinations of embodiments described herein. The above description is intended to be illustrative, and not restrictive, and that the phraseology or terminology employed herein is for the purpose of description.

What is claimed is:

1. A memory device comprising:
an array of memory cells, each memory cell having a charge storage region separated from a channel structure by a tunnel region, the tunnel region having multiple regions including:
a first dielectric region adjacent to and contacting the channel structure, material of the first dielectric region being different from silicon oxide and having a dielectric constant less than that of silicon nitride, the first dielectric region being silicon oxynitride doped with carbon and boron;
one or more additional dielectric regions between the first dielectric region and the charge storage region, the one or more additional dielectric regions including a second dielectric region having a dielectric constant greater than that of silicon nitride.

2. The memory device of claim 1, wherein the first dielectric region has a lowest dielectric constant of the multiple regions of the tunnel region.

3. The memory device of claim 1, wherein the one or more additional dielectric regions include a third dielectric region between the first dielectric region and the second dielectric region, material of the third dielectric region being a doped silicon oxynitride having a different compositional content from the material of the first dielectric region.

4. The memory device of claim 3, wherein the doped silicon oxynitride of the third dielectric region is doped with carbon or boron, the third dielectric region having a different nitrogen content than the first dielectric region.

5. The memory device of claim 1, wherein the second dielectric region is adjacent to and contacts the first dielectric region and the one or more additional dielectric regions includes a third dielectric region and a fourth dielectric region between the second dielectric region and the charge storage region, dielectric constants of the third dielectric region and the fourth dielectric region being different from each other and less than that of silicon nitride.

6. A memory device comprising:
an array of memory cells, each memory cell having a charge storage region separated from a channel structure by a tunnel region, the tunnel region having multiple regions including:
a first dielectric region adjacent to and contacting the channel structure, material of the first dielectric region being different from silicon oxide and having a dielectric constant less than that of silicon nitride;
one or more additional dielectric regions between the first dielectric region and the charge storage region, the one or more additional dielectric regions including a second dielectric region having a dielectric greater than that of silicon nitride, wherein:
the second dielectric region is adjacent to and contacts the first dielectric region; and
the one or more additional dielectric regions include:
a third dielectric region having a dielectric constant greater than that of silicon nitride, the third dielectric region being adjacent to and contacting the second dielectric region, dielectric constants of the second dielectric region and the third dielectric region being different from each other; and
a fourth dielectric region between the third dielectric region and the charge storage region, the fourth dielectric region having a dielectric constant less than that of silicon nitride.

7. The memory device of claim 1, wherein the one or more additional dielectric regions include dielectric non-metal oxide regions with material of each dielectric non-metal oxide region including silicon oxynitride doped with carbon or boron, with silicon oxynitride in different dielectric non-metal oxide regions having a different nitrogen profile or a different doping profile.

8. The memory device of claim 1, wherein the second dielectric region includes a metal oxide.

9. The memory device of claim 8, wherein material of the second dielectric region includes a dielectric single metal oxide or a dielectric double metal oxide.

10. The memory device of claim 9, wherein metal in the single metal oxide or double metal oxide includes one or more of hafnium, zirconium, or aluminum.

11. A memory device comprising;
an array of memory cells, each memory cell having a charge storage region separated from a channel structure by a tunnel region, the tunnel region having multiple regions including:

a silicon oxynitride region adjacent to and contacting the charge storage region, the silicon oxynitride having varying content of nitrogen as a function of distance across the silicon oxynitride; and a silicon oxide region adjacent to and contacting the channel structure, the silicon oxide region being undoped silicon dioxide.

12. The memory device of claim 11, wherein the silicon oxide region has a thickness equal to or less than one-half of a thickness of the silicon oxynitride region.

13. The memory device of claim 11, wherein the silicon oxide region has a thickness equal to or less than one-third of a thickness of the silicon oxynitride region.

14. The memory device of claim 11, wherein the silicon oxynitride region includes multiple sub-regions of silicon oxynitride having different nitrogen concentrations as a function of distance across the respective sub-regions.

15. The memory device of claim 11, wherein the charge storage region includes silicon nitride and the channel structure includes polysilicon.

* * * * *